(12) United States Patent
Thery

(10) Patent No.: US 10,103,701 B2
(45) Date of Patent: Oct. 16, 2018

(54) CHANNEL SELECTOR FOR A RADIO FREQUENCY RECEIVER

(71) Applicants: CONTINENTAL AUTOMOTIVE FRANCE, Toulouse (FR); CONTINENTAL AUTOMOTIVE GmbH, Hannover (DE)

(72) Inventor: Laurent Thery, Les Essart le Roi (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 0 days.

(21) Appl. No.: 15/553,288

(22) PCT Filed: Feb. 22, 2016

(86) PCT No.: PCT/EP2016/000304
§ 371 (c)(1),
(2) Date: Aug. 24, 2017

(87) PCT Pub. No.: WO2016/134839
PCT Pub. Date: Sep. 1, 2016

(65) Prior Publication Data
US 2018/0041180 A1    Feb. 8, 2018

(30) Foreign Application Priority Data
Feb. 25, 2015  (FR) ...................... 15 51629

(51) Int. Cl.
*H04B 15/00*     (2006.01)
*H03G 5/24*      (2006.01)
(Continued)

(52) U.S. Cl.
CPC .............. *H03G 5/24* (2013.01); *H03D 3/005* (2013.01); *H04L 27/10* (2013.01)

(58) Field of Classification Search
CPC ......... H03D 3/005; H03D 3/242; H04L 27/10
(Continued)

(56) References Cited

U.S. PATENT DOCUMENTS 5,642,385 A * 6/1997 Alberty .................. H03D 3/242
                                                          375/344
6,347,121 B1 * 2/2002 Sointula ............... H04B 1/0003
                                                          375/222
(Continued)

FOREIGN PATENT DOCUMENTS

GB          903107 A       8/1962

OTHER PUBLICATIONS

International Search Report, dated May 3, 2016, from corresponding PCT application No. PCT/EP2016/000304.

*Primary Examiner* — Sonny Trinh
(74) *Attorney, Agent, or Firm* — Young & Thompson

(57) ABSTRACT

A channel selector for a frequency modulation radio frequency receiver, including a band-pass filter, of which the frequency band is centered on the central frequency of the channel to be selected, and has a width that is automatically variable between a minimum value and a maximum value, the minimum value being determined dynamically proportional to a weighted sum of the field level and the modulation level of the channel, according to a formula MinBW=k1×C+k2×M, in which MinBW is the minimum value, C the field level, k1 the weight associated with the field level, M the modulation level, and k2 the weight associated with the modulation level. The weight associated with the field level is less than the weight associated with the modulation level, preferably in a ratio of 1:3.

20 Claims, 4 Drawing Sheets

(51) Int. Cl.
*H04L 27/10* (2006.01)
*H03D 3/00* (2006.01)

(58) Field of Classification Search
USPC .............. 455/62, 450, 151.1, 63.1, 63.3
See application file for complete search history.

(56) References Cited

U.S. PATENT DOCUMENTS

| | | | | |
|---|---|---|---|---|
| 6,724,246 | B2* | 4/2004 | Oberschmidt | H03D 3/009 |
| | | | | 329/304 |
| 6,728,294 | B1* | 4/2004 | Kohno | H04B 1/715 |
| | | | | 342/367 |
| 7,783,271 | B2* | 8/2010 | Samuels | H03D 7/163 |
| | | | | 455/105 |
| 8,315,569 | B2* | 11/2012 | Harada | H04W 16/14 |
| | | | | 455/62 |
| 9,831,845 | B2* | 11/2017 | Tanaka | H03G 3/3036 |

* cited by examiner

CHANNEL SELECTOR FOR A RADIO FREQUENCY RECEIVER

BACKGROUND OF THE INVENTION

The present invention relates to the field of radiofrequency reception, and more particularly to a selector fitted in a frequency-modulation radiofrequency receiver for selecting a channel.

In a known manner, a frequency-modulation radiofrequency signal uses a center frequency characteristic of a channel, and encodes its information by varying the frequency around said center frequency.

In many countries, the frequency-modulation frequency plan has center frequencies every 200 kHz. As illustrated in FIG. 1, showing the power P as a function of the frequency F, a channel $C_0$ thus has a total modulation range EMT of between 100 kHz below the center frequency $F_0$ and 100 kHz above the center frequency $F_0$. In practice, in order to avoid risks of overlapping, and to facilitate the extraction, or the selection, of a channel from an entire received signal that may contain a multitude of channels, the modulation range is limited to a useful modulation range EMU, typically equal to 75% of the total modulation range EMT, i.e. a width of 150 kHz, centered around the center frequency $F_0$, i.e. a useful modulation range EMU of between 75 kHz below the center frequency $F_0$ and 75 kHz above the center frequency $F_0$. Organizing and using the frequency spectrum in this way implies a comfortable margin MA between a channel $C_0$ and an adjacent channel $C_1$. A channel $C_0$ is typically selected by means of a bandpass filter or selector filter 2, the frequency band BPF of which is centered on the center frequency $F_0$ of the channel $C_0$ and has a width corresponding to the width of the total modulation range EMT, i.e. 200 kHz in the previous example. This width BPF is preferably able to be limited to the width of the useful modulation range EMU, i.e. 150 kHz in the previous example.

The selector filter 2 receives, as input, an initial signal 8 (cf. FIG. 5), which may be a base-frequency signal, originating directly from the antenna, or a signal whose frequency has already been lowered, such as an intermediate-frequency signal. It produces, as output, a signal 9 that is homologous, but confined only to the channel $C_0$, in the frequency band BPF. This output signal 9 is able to be processed by a demodulator.

However, in practice, for various reasons such as variations in the frequency plan from one country to another, or indeed local conditions of implementation, mean that a signal may impinge on the modulation range EMU, EMT of the channel $C_0$. Such a signal then becomes an interference signal 3 in relation to the channel $C_0$.

The result of an interference signal 3, here a signal e1, being present in the useful modulation range EMU of a channel $C_0$ conveying a signal e0 is illustrated in FIGS. 3 and 4. FIG. 3 shows a filter 2, the frequency band BPF of which is tailored to the useful modulation range EMU of the channel $C_0$. This frequency band BPF is centered on the center frequency $F_0$ of the channel $C_0$ and effectively encompasses the signal $e_0$. However, on account of an excessively wide frequency band BPF, the filter 2 still at least partially retains the interference signal $e_1$. As illustrated in FIG. 4, the portion of the interference signal $e_1$ retained by the filter 2 is superimposed on the signal $e_0$. The resultant signal, which is highly distorted, produces an audio output that is highly unpleasant to the ear.

It is therefore advantageous, for a selector 1, to reduce the width of the frequency band BPF of the filter 2 when an interference signal 3 is present in the useful modulation range EMU, in order to eject said interference signal 3 from the frequency band BPF retained by the filter 2. Thus, as illustrated in FIG. 2, a frequency band BPF filter 2 confined to the envelope shown in an unbroken line makes it possible to effectively eliminate the interference signal 3.

However, it is appreciated that reducing the frequency band BPF in this manner is detrimental, in that it eliminates a portion of the signal $e_0$ from the channel $C_0$, and is particularly undesirable in the absence of interference 3.

Therefore, according to prior art illustrated in FIG. 5, it is known to produce a selector 1, the frequency band BPF of the bandpass filter 2 of which is centered on the center frequency $F_0$ of the channel $C_0$ to be selected and has a width that is able to be adjusted automatically. This enables the selector 1 to adapt to changing environmental radiofrequency conditions. Such a selector 1 thus determines, continuously and in an adaptive manner, a frequency bandwidth BPF of the filter 2 depending on measurements that are indicative of the presence or of the absence of interference, and that is able to situate said interference outside of said frequency band.

One example of this prior art is a device 4, for example in the form of an integrated circuit 4, with the reference SAF7741HV, produced by NXP. The content of such a device 4 remains proprietary and is known only in 'black box' mode, by its inputs and outputs. As output, the device 4 produces a frequency band BPF for a selector filter 2, or, more precisely, the center frequency $F_0$ remaining identical for a given channel $C_0$, the device 4 produces a width of this frequency band BPF. This output is determined depending on the inputs. As input, the device 4 receives a signal B indicative of the noise level present in the channel $C_0$, typically provided by a noise level sensor 7 working on the signal 9 at the output of the selector 1, a signal M indicative of the modulation level of the channel $C_0$, typically provided by a modulation level sensor 6 working on the signal 9 at the output of the selector 1, and a signal C indicative of the received field level for the channel $C_0$, typically provided by a field level sensor 5 working on the signal 9 at the output of the selector 1. The exact algorithm for transforming the inputs to determine the output (width of BPF) is not known. It is known, however, that the width at the output is an increasing function of the modulation level M, a decreasing function of the noise level B, and an increasing function of the field level C. The width of the frequency band BPF thus increases with the modulation level M, but is reduced, in contrast, when the noise B increases and/or when the field level C decreases very substantially.

It should be noted that, in the prior art, the modulation level M is used to determine the weighting defining the filter 2. In no case is the modulation level M used to determine the minimum value of the filter 2.

The device 4 also receives other parameters, which are not shown, as input. It may thus include temporal parameters, making it possible to configure the attack and release time constants Ta and Tr, when transients occur. Regulating these parameters makes it possible to achieve stability in the control determining the width of the frequency band BPF.

In order to limit the range of variation in the width of the frequency band BPF and to prevent excessively significant drift, the device 4 also receives, as input, a minimum value MinBP0 of the width of the frequency band BPF and a maximum value MaxBP0 of the width of the frequency band BPF. These two values MinBP0, MaxBP0 are used as boundaries, min and max, respectively, in order to saturate the frequency bandwidth BPF. In the prior art, these two values MinBP0, MaxBP0 are constants.

The maximum value MaxBP0 is typically taken to be equal to the useful modulation range EMU of the channel $C_0$. This is a value of 150 kHz, looking again at the previous example.

The minimum value MinBP0 results from a compromise. The smaller this minimum value MinBP0, the more it is possible to continue to select a channel $C_0$ despite a high level of interference B, but the more the channel $C_0$ thus selected will have a tendency to produce an impaired audio output. If this value MinBP0 is greater, the channel $C_0$ will produce a less impaired audio output on average, but the selection will be cut off at a lower level of interference B.

Therefore, a compromise is reached depending on the client; depending on the type of radiofrequency environment that it encounters and, above all, depending on its attitude toward tolerating a distorted audio output as opposed to the cutoffs in reception. The set minimum value MinBP0 is defined in the factory by the manufacturer, depending on the client and/or on the market, at a set adjustment value. In practice, with the numerical values from the previous example, the minimum value MinBP0 of the width of the frequency band BPF typically varies between 30 and 50 kHz.

BRIEF SUMMARY OF THE INVENTION

However, it appears, according to the invention, that the overall performance of a selector 1 and its ability to adapt to the environment may be improved.

Specifically, it appears that the use of a device 4 to control the width of the frequency band BPF leads, out of precaution, to a frequency bandwidth BPF that is often too small. Therefore, when the characteristics of the channel $C_0$ allow, the invention proposes dynamically adjusting the minimum value MinBP of the width in order to compel the frequency bandwidth to take a higher value.

One subject of the invention is a channel selector for a frequency-modulation radiofrequency receiver, the minimum value of the width of the frequency band of which is adjusted dynamically depending on the characteristics of the channel.

The invention relates to a channel selector for a frequency-modulation radiofrequency receiver, comprising a bandpass filter, the frequency band of which is centered on the center frequency of the channel to be selected and has a width that is variable automatically between a minimum value and a maximum value, the minimum value being determined dynamically.

The invention thus proposes an advantageous means for benefiting from the advantages of the automatic variation in the frequency bandwidth, also termed dynamic selectivity, without being subject to all of the drawbacks thereof. The invention advantageously makes it possible to modify the behavior of the device for determining the frequency bandwidth from the prior art, while reusing it in black box form, without modifying it.

According to another feature, the minimum value is determined depending on a modulation level of the channel.

According to another feature, the minimum value is determined depending on a field level of the channel.

According to another feature, the minimum value is determined in proportion to a weighted sum of the field level and the modulation level, in accordance with a formula $MinBW = k1 \times C + k2 \times M$, where MinBW is the minimum value, C is the field level, k1 is the weight associated with the field level, M is the modulation level, and k2 is the weight associated with the modulation level.

According to another feature, the weight associated with the field level is lower than the weight associated with the modulation level, preferably in a ratio of 1:3.

According to another feature, the field level and/or the modulation level are measured on a measurement frequency band equal to the frequency band of the filter.

According to another feature, the maximum value is constant and equal to the total modulation range of the channel, preferably equal to the useful modulation range of the channel.

According to another feature, the minimum value is decreased by way of a maximum boundary equal to the maximum value and increased by way of a minimum boundary, preferably of between half and double a minimum value from the prior art, which is usually between 30 and 50 kHz, more preferably equal to said minimum value from the prior art.

The invention also relates to a radiofrequency receiver comprising such a channel selector.

BRIEF DESCRIPTION OF THE SEVERAL VIEWS OF THE DRAWINGS

Other features, details and advantages of the invention will emerge more clearly from the detailed description given hereinafter by way of indication in relation to the drawings, in which.

DETAILED DESCRIPTION OF THE INVENTION

Figure 1:
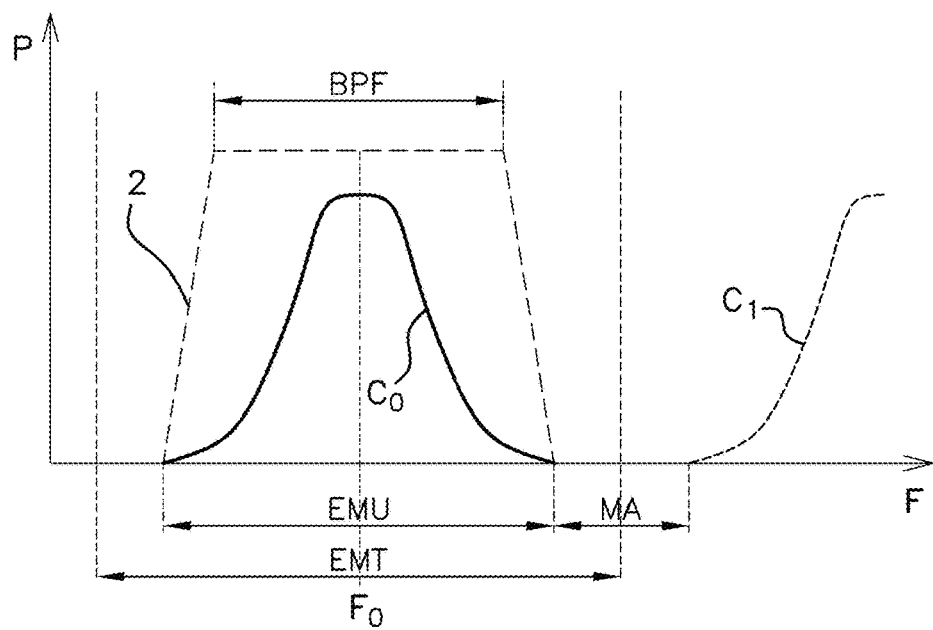
FIG. 1, already described, illustrates, in a frequency diagram, the division of the radio band into channels, FIG. 2, already described, illustrates, in a frequency diagram, a channel that is distorted by an interference signal, FIG. 3, already described, illustrates two close signals, FIG. 4, already described, illustrates the signal resulting from the two close signals from FIG. 3 following selection by a frequency band filter of excessive width, FIG. 5, already described, illustrates a selector equipped with a device that ensures an automatic variation in the width of the frequency band of the selector filter, from the prior art.
Figure 2:
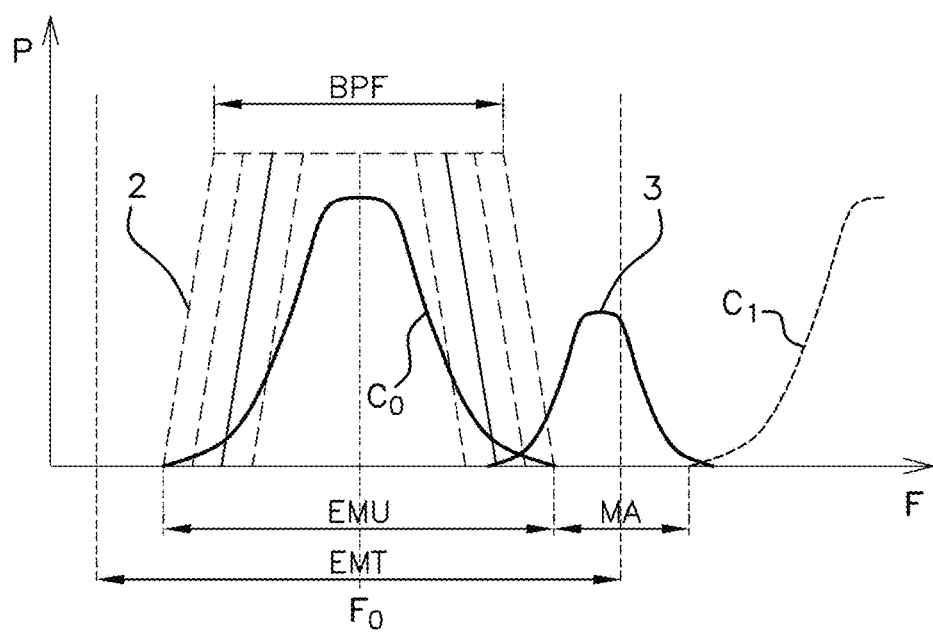
Figure 3:
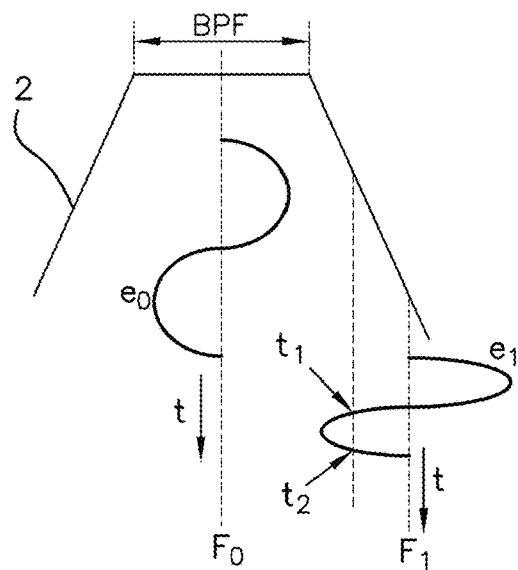
Figure 4:
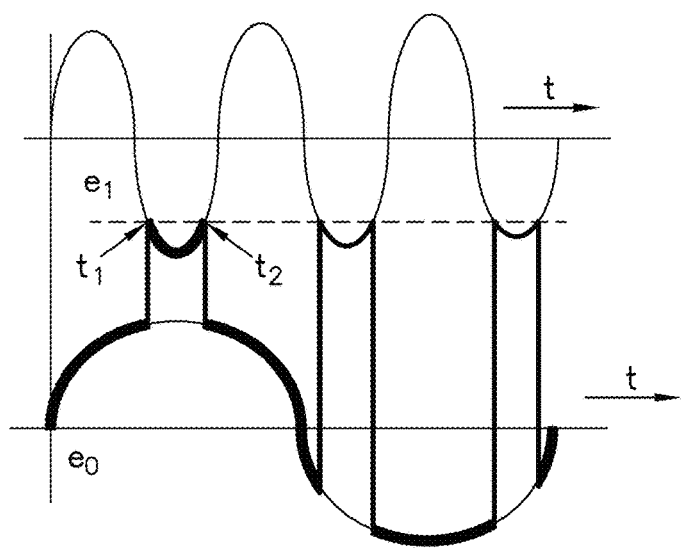
Figure 5:
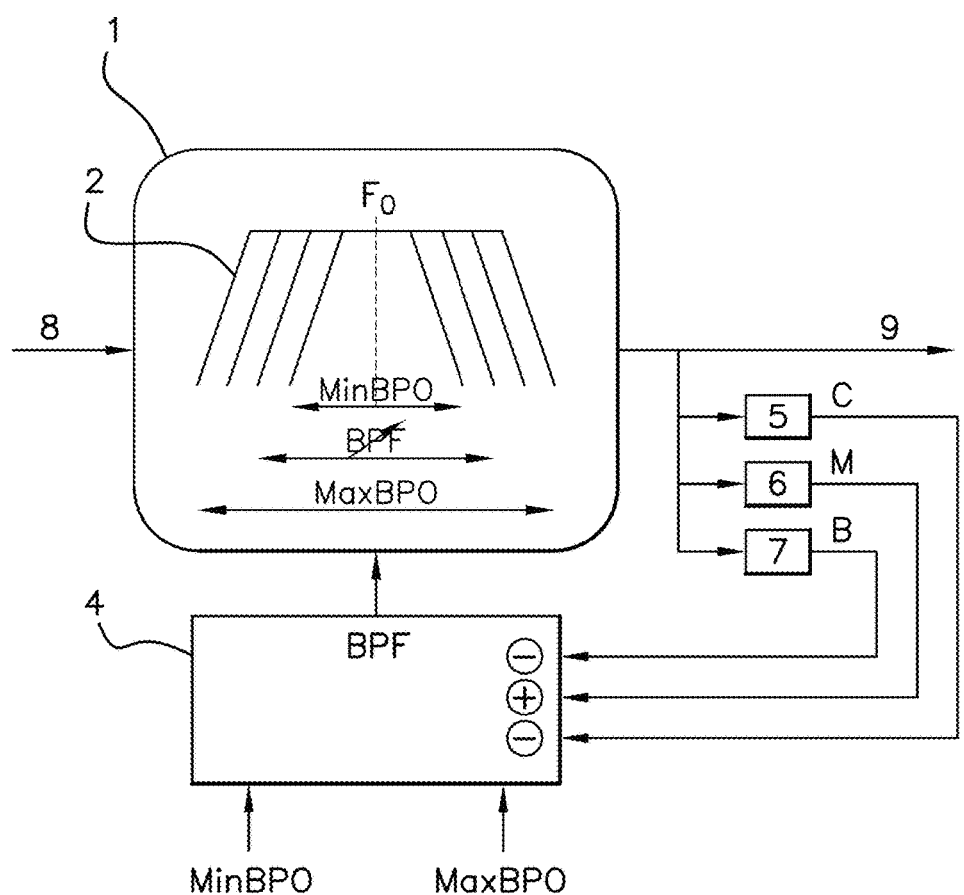
Figure 6:
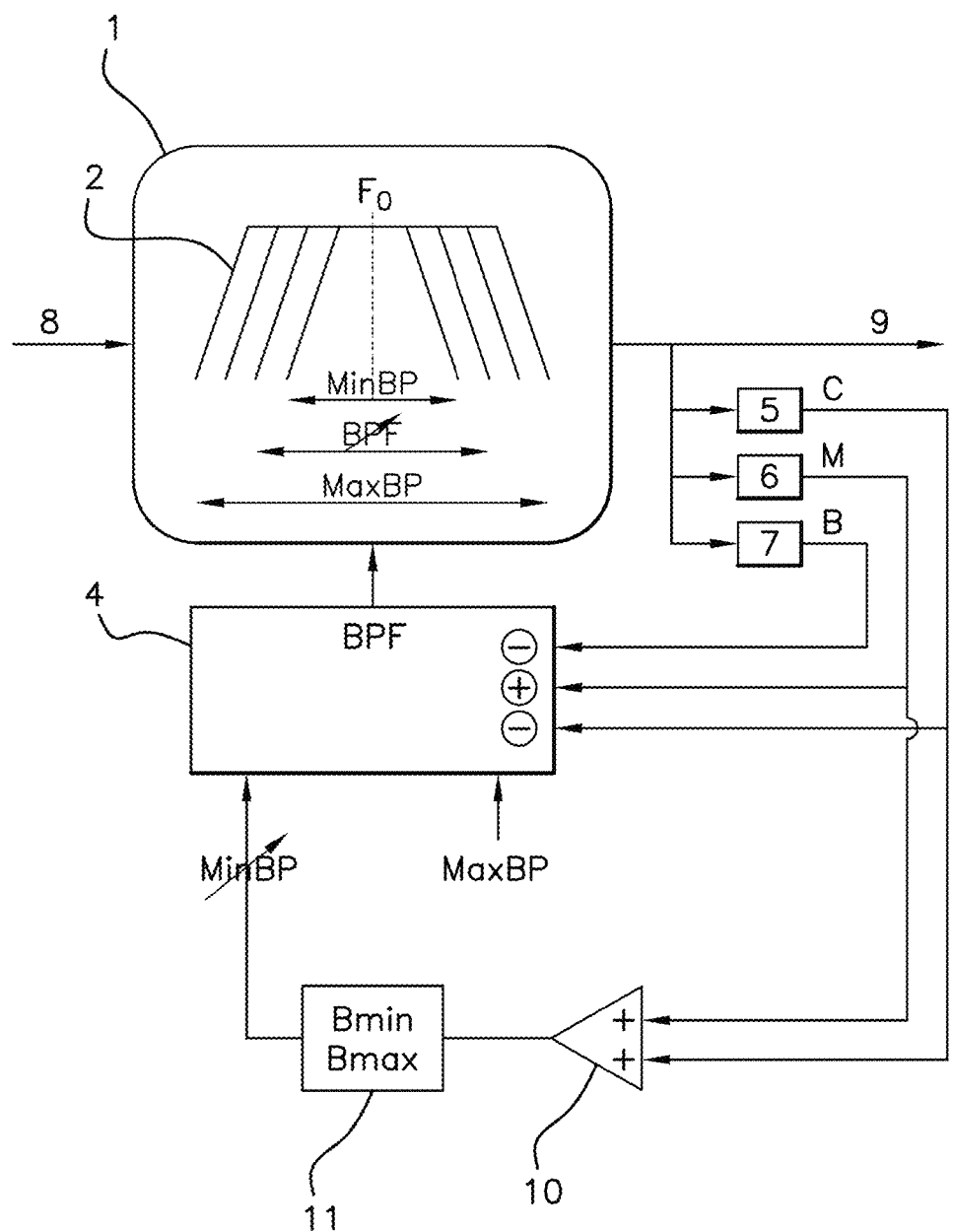
FIG. 6 illustrates a selector equipped with a device that ensures an automatic variation in the width of the frequency band of the selector filter, and a means for dynamically determining the minimum value of the width, according to the invention.

As illustrated in FIG. 6, in comparison with FIG. 5, a channel $C_0$ selector 1 for a frequency-modulation radiofrequency receiver, according to the invention, comprises a bandpass filter 2 or selector filter 2.

The selector 1 receives, as input, an initial signal 8, which may be a base-frequency signal, originating directly from the antenna, or a signal whose frequency has been lowered beforehand, such as an intermediate-frequency signal. It produces, as output, a signal 9 that is homologous, but confined in terms of frequency only to the channel $C_0$, as filtered by the selector filter 2, in the frequency band BPF. The signal 9 is able to be processed by a demodulator.

The bandpass filter 2 is characterized by a filter frequency band BPF, which is centered on a center frequency $F_0$ characteristic of the channel $C_0$ to be selected and has a variable width. In accordance with this variability, the width of the frequency band BPF is typically controlled depending on reception quality characteristics of the channel $C_0$. This variability is however advantageously restricted between a minimum value MinBP and a maximum value MaxBP. This is achieved, for example, by a device 4 such as described previously.

Until now, both the maximum value MaxBP and the minimum value MinBP were constant. The result of this is that, as soon as the conditions of the channel $C_0$ are impaired, this being detected through the field level C or the noise level B, controlling the width of the frequency band BPF has a tendency to reduce the width until saturating said width at the minimum value MinBP.

This may have consequences, in terms of variation in the sound level, which are highly unpleasant to the listener. Therefore, in order to minimize these unpleasant effects, while profiting from the benefits of the automatic variation in the frequency bandwidth, also termed dynamic selectivity, the invention proposes removing the constancy of the minimum value MinBP, and replacing it with a value that is determined dynamically, depending on the characteristics of the signal.

One important characteristic consists in taking into consideration the dynamic range of the signal received via the channel $C_0$. One known indicator of this dynamic range is the modulation level M. This modulation level M is indicative of the richness of the signal, in that it is indicative of the frequency bandwidth that is effectively used by the signal. The modulation level M is conventionally determined on the basis of the received signal, by a modulation sensor 6. The modulation sensor 6 typically comprises a low-pass filter. The filtered signal is then processed by a modulation detector, which determines the modulation level M of the signal.

As illustrated in FIG. 6, the components 10,11 determining the minimum value MinBP comprise a summer 10. The minimum value MinBP is an increasing function of the modulation level M. Thus, the larger the dynamic range of the signal, the more the minimum value MinBP increases.

According to one additional optional feature, a field level C is also taken into account. This field level C is indicative of the reception quality of the channel $C_0$. The field level C is conventionally determined on the basis of the envelope of the received signal, by a field level detector 5.

As illustrated in FIG. 6, the components 10,11 determining the minimum value MinBP comprise a summer 10. The minimum value MinBP is an increasing function of the field level C. Thus, the greater the field level of the signal, the more the minimum value MinBP increases.

According to one preferred embodiment, the minimum value MinBP is determined by a linear combination, in the form of a weighted sum of the field level C and the modulation level M, in accordance with a formula MinBW=k1×C+k2×M, where MinBW is the minimum value of the width of the frequency band BPF, C is the field level, k1 is the weight associated with the field level C, M is the modulation level, and k2 is the weight associated with the modulation level M, k1 and k2 being positive.

According to one embodiment, the contribution comes primarily from the modulation level M and secondarily from the field level C. Therefore, in the previous formula, the weight k1 associated with the field level C is lower than the weight k2 associated with the modulation level M. A ratio k2:k1 preferably equal to 3 has shown advantageous results.

Both the modulation level M and the field level C that were used previously are advantageously indicative of the signal received via the channel $C_0$. Therefore, as indicated in FIG. 6, the modulation sensor 6 is arranged downstream of the filter 2 and processes the signal 9 originating from the channel $C_0$, as selected by the filter 2. Likewise, the field sensor 5 is arranged downstream of the filter 2 and processes the signal 9 originating from the channel $C_0$, as selected by the filter 2. The field level C and/or the modulation level M are thus measured on a measurement frequency band BPM equal to the frequency band of the filter BPF, i.e. a measurement frequency band BPM centered on the center frequency $F_0$ of the channel $C_0$ to be selected and with a width equal to the controlled width and that is variable automatically.

In a manner comparable with the prior art, the maximum value MaxBP is constant and equal to the total modulation range EMT of the channel $C_0$. Advantageously, this maximum width may be confined to the useful modulation range EMU of the channel $C_0$. The maximum value MaxBP may thus be taken to be equal to the maximum value from the prior art MaxBP0. Thus, in the values of the example, the maximum value MaxBP may be equal to a total modulation range EMT of 200 kHz, or preferably equal to a useful modulation range EMU of 150 kHz.

As was described previously, the minimum value MinPB is variable. Since it is derived from an algorithm that is not necessarily convergent, it is desirable to limit its variation domain through a maximum boundary Bmax and through a minimum boundary Bmin. This is performed by the saturator component 11.

According to one embodiment, the maximum boundary Bmax is advantageously equal to the maximum value MaxBP.

According to one embodiment, the minimum boundary Bmin is advantageously equal to the minimum value MinBP0 that is used, as a constant value, in the prior art.

However, the fact that the minimum value MinBP is determined dynamically guarantees an optimized value of this minimum value MinBP depending on the characteristics of the signal. It is therefore possible to extend downward, or, by contrast, to restrict, the interval of variation [Bmin, Bmax] of the minimum width MinBP by taking a minimum boundary value Bmin that may be as low as half MinBP0/2 of the minimum value MinBP0 used in the prior art or, in contrast, as high as double 2*MinBP0 the minimum value MinBP0 used in the prior art.

Thus, in the example, for a value MinBP0 from the prior art of 40 kHz, it is possible to adopt a minimum boundary Bmin of any value between 20 kHz and 80 kHz.

According to one feature of the invention, the repetition frequency of the dynamic determination of the minimum value MinBP is less than or equal to the repetition frequency of the automatic variation of the frequency bandwidth, such as employed by the device 4. The dynamic determination frequency is advantageously a submultiple, with a ratio of between 1000 and 100000.

The invention also relates to a radiofrequency receiver comprising such a selector 1.

The invention claimed is:

1. A channel ($C_0$) selector (1) for a frequency-modulation radiofrequency receiver, comprising a bandpass filter (2), the frequency band (BPF) of which is centered on the center frequency ($F_0$) of the channel ($C_0$) to be selected and has a width that is variable automatically between a minimum value (MinBP) and a maximum value (MaxBP), the minimum value (MinBP) being determined dynamically in proportion to a weighted sum of the field level (C) and the modulation level (M) of the channel ($C_0$), in accordance with a formula MinBW=k1×C+k2×M, where MinBW is the minimum value, C is the field level, k1 is the weight associated with the field level (C), M is the modulation level, and k2 is the weight associated with the modulation level (M), wherein the weight (k1) associated with the field level (C) is lower than the weight (k2) associated with the modulation level (M).

2. The selector (1) as claimed in claim 1, wherein the field level (C) and/or the modulation level (M) are measured on a measurement frequency band (BPM) equal to the frequency band of the filter (BPF).

3. The selector (1) as claimed in claim 2, wherein the maximum value (MaxBP) is constant and equal to the total modulation range (EMT) of the channel ($C_0$).

4. The selector of claim 3, wherein the maximum value (MaxBP) is also equal to the useful modulation range (EMU) of the channel (C0).

5. The selector (1) as claimed in claim 2, wherein the minimum value (MinBP) is increased by way of a maximum boundary (Bmax) equal to the maximum value (MaxBP) and decreased by way of a minimum boundary (Bmin).

6. A radiofrequency receiver comprising the channel selector (1) as claimed in claim 2.

7. The selector (1) as claimed in claim 1, wherein the maximum value (MaxBP) is constant and equal to the total modulation range (EMT) of the channel ($C_0$).

8. The selector of claim 7, wherein the maximum value (MaxBP) is also equal to the useful modulation range (EMU) of the channel ($C_0$).

9. The selector (1) as claimed in claim 7, wherein the minimum value (MinBP) is increased by way of a maximum boundary (Bmax) equal to the maximum value (MaxBP) and decreased by way of a minimum boundary (Bmin).

10. The selector of claim 9, wherein the maximum value (MaxBP) is also equal to the useful modulation range (EMU) of the channel (C0).

11. A radiofrequency receiver comprising the channel selector (1) as claimed in claim 7.

12. The selector (1) as claimed in claim 1, wherein the minimum value (MinBP) is increased by way of a maximum boundary (Bmax) equal to the maximum value (MaxBP) and decreased by way of a minimum boundary (Bmin).

13. The selector of claim 12, wherein the minimum boundary (Bmin) is between half and double a minimum value (MinBP0) of between 30 and 50 kHz.

14. The selector of claim 12, wherein the minimum boundary (Bmin) is equal to a minimum value (MinBP0) of between 30 and 50 kHz.

15. A radiofrequency receiver comprising the channel selector (1) as claimed in claim 12.

16. A radiofrequency receiver comprising the channel selector (1) as claimed in claim 1.

17. The selector of claim 1, wherein a ratio of the weight (k1) associated with the field level (C) to the weight (k2) associated with the modulation level (M) is 1:3.

18. The selector (1) as claimed in claim 17, wherein the field level (C) and/or the modulation level (M) are measured on a measurement frequency band (BPM) equal to the frequency band of the filter (BPF).

19. The selector (1) as claimed in claim 17, wherein the maximum value (MaxBP) is constant and equal to the total modulation range (EMT) of the channel (C0).

20. The selector (1) as claimed in claim 17, wherein the minimum value (MinBP) is decreased by way of a maximum boundary (Bmax) equal to the maximum value (MaxBP) and increased by way of a minimum boundary (Bmin).

* * * * *